United States Patent
Choi

(10) Patent No.: US 11,127,687 B2
(45) Date of Patent: Sep. 21, 2021

(54) SEMICONDUCTOR PACKAGES INCLUDING MODULES STACKED WITH INTERPOSING BRIDGES

(71) Applicant: SK hynix Inc., Icheon-si (KR)

(72) Inventor: Bok Kyu Choi, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/903,891

(22) Filed: Jun. 17, 2020

(65) Prior Publication Data

US 2021/0217700 A1    Jul. 15, 2021

(30) Foreign Application Priority Data

Jan. 10, 2020  (KR) ........................ 10-2020-0003929

(51) Int. Cl.
*H01L 23/538*    (2006.01)
*H01L 25/065*    (2006.01)

(52) U.S. Cl.
CPC ...... *H01L 23/5384* (2013.01); *H01L 23/5381* (2013.01); *H01L 23/5385* (2013.01); *H01L 23/5386* (2013.01); *H01L 25/0657* (2013.01)

(58) Field of Classification Search
CPC ............ H01L 23/5384; H01L 23/5381; H01L 23/5385; H01L 23/5386; H01L 25/0657
USPC ............... 257/774, 737, 751, 777, 666, 686, 257/E23.011, E23.021, E23.052, E23.143, 257/E23.17, E23.174, E21.506, E21.586, 257/E21.587, E25.018; 438/107, 109, 438/667

See application file for complete search history.

(56) References Cited

U.S. PATENT DOCUMENTS

| | | | |
|---|---|---|---|
| 9,508,704 B2 * | 11/2016 | Chung | H01L 23/3135 |
| 2017/0018527 A1 * | 1/2017 | Lee | H01L 23/49822 |
| 2020/0075490 A1 * | 3/2020 | Sung | H01L 25/105 |
| 2021/0118847 A1 * | 4/2021 | Chuang | H01L 23/5385 |
| 2021/0175218 A1 * | 6/2021 | Choi | H01L 25/105 |
| 2021/0193622 A1 * | 6/2021 | Choi | H01L 25/0657 |

FOREIGN PATENT DOCUMENTS

| | | |
|---|---|---|
| KR | 101046252 B1 | 7/2011 |
| KR | 101069441 B1 | 9/2011 |

* cited by examiner

*Primary Examiner* — Dao H Nguyen
(74) *Attorney, Agent, or Firm* — William Park & Associates Ltd.

(57) ABSTRACT

A semiconductor package includes a lower module and an upper module stacked on the lower module. Each of the lower module and the upper module includes a semiconductor chip, an interposing bridge, an encapsulant, and a redistributed line (RDL). The interposing bridge is configured to include a first through via and a second through via. The upper module is laterally offset, relative to the lower module, by an array pitch of the first and second through vias such that the first through via of the upper module overlaps with and is connected to the second through via of the lower module.

20 Claims, 17 Drawing Sheets

SEMICONDUCTOR PACKAGES INCLUDING MODULES STACKED WITH INTERPOSING BRIDGES

CROSS-REFERENCE TO RELATED APPLICATIONS

The present application claims priority under 35 U.S.C 119(a) to Korean Application No. 10-2020-0003929, filed on Jan. 10, 2020, which is incorporated herein by references in its entirety.

BACKGROUND

1. Technical Field

The present disclosure relates to semiconductor package technologies and, more particularly, to semiconductor packages including modules stacked with interposing bridges.

2. Related Art

Recently, a lot of focus has been directed to integrating a plurality of semiconductor chips into one semiconductor package. That is, attempts to increase package integration density have been made to produce high performance semiconductor packages that process a large amount of data at a high speed. A plurality of semiconductor chips, included in each semiconductor package, may be vertically stacked, resulting in the increased thickness of the semiconductor packages. In order to compensate for increase of a thickness of the semiconductor packages, a fan-out package technique has been applied to the semiconductor packages.

SUMMARY

According to an embodiment, a semiconductor package includes a lower module and an upper module stacked on the lower module. The lower module includes a lower semiconductor chip, a lower interposing bridge spaced apart from the lower semiconductor chip and configured to include a first lower through via and a second lower through via, a lower encapsulant encapsulating the lower semiconductor chip and the lower interposing bridge, and a lower redistributed line (RDL) extending to connect the lower semiconductor chip to the first lower through via. The upper module includes an upper semiconductor chip, an upper interposing bridge spaced apart from the upper semiconductor chip and configured to include a first upper through via and a second upper through via, an upper encapsulant encapsulating the upper semiconductor chip and the upper interposing bridge, and an upper RDL extending to connect the upper semiconductor chip to the first upper through via. The first upper through via overlaps with the second lower through via.

According to another embodiment, a semiconductor package includes a lower module and an upper module stacked on the lower module. The lower module includes a lower semiconductor chip and a first lower interposing bridge spaced apart from the lower semiconductor chip and configured to include a first lower through via and a second lower through via. The first lower through via is disposed between the lower semiconductor chip and the second lower through via. The lower module further includes a second lower interposing bridge spaced apart from the lower semiconductor chip on an opposite side of the lower semiconductor chip, compared to the first lower interposing bridge, and configured to include a third lower through via and a fourth lower through via. The fourth lower through via is disposed between the lower semiconductor chip and the third lower through via. The lower module further includes a lower encapsulant encapsulating the lower semiconductor chip and the first and second lower interposing bridges, a first lower redistributed line (RDL) extending to connect the lower semiconductor chip to the first lower through via, and a second lower RDL extending to connect the lower semiconductor chip to the third lower through via. The upper module includes an upper semiconductor chip and a first upper interposing bridge spaced apart from the upper semiconductor chip and configured to include a first upper through via and a second upper through via. The first upper through via is disposed between the upper semiconductor chip and the second upper through via. The upper module further includes a second upper interposing bridge spaced apart from the upper semiconductor chip on an opposite side of the lower semiconductor chip, compared to the first upper interposing bridge, and configured to include a third upper through via and a fourth upper through via. The fourth upper through via is disposed between the upper semiconductor chip and the third upper through via. The upper module further includes an upper encapsulant encapsulating the upper semiconductor chip and the first and second upper interposing bridges, a first upper RDL extending to connect the upper semiconductor chip to the first upper through via, and a second upper RDL extending to connect the upper semiconductor chip to the third upper through via. The first upper through via overlaps with the second lower through via.

According to yet another embodiment, a semiconductor package includes a lower module and an upper module stacked on the lower module. Each of the lower module and the upper module includes a semiconductor chip, an interposing bridge spaced apart from the semiconductor chip and configured to include a first through via and a second through via, an encapsulant encapsulating the semiconductor chip and the interposing bridge, and a redistributed line (RDL) extending to connect the semiconductor chip to the first through via. The upper module is laterally offset, relative to the lower module, by an array pitch of the first and second through vias such that the first through via of the upper module overlaps with and is connected to the second through via of the lower module.

DETAILED DESCRIPTION OF THE EMBODIMENTS

Figure 1:
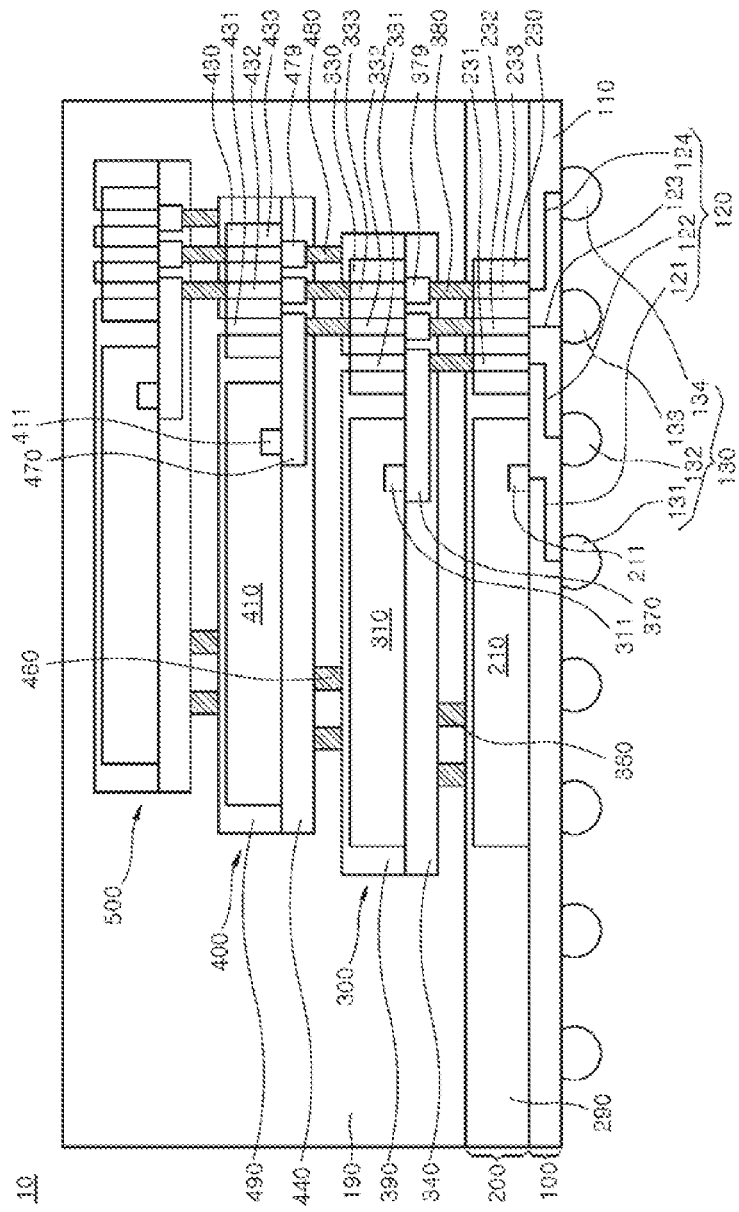
FIG. 1 is a cross-sectional view illustrating a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong. It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

In the following embodiments, a semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips, application specific integrated circuits (ASIC) chips, application processors (APs), graphic processing units (GPUs), central processing units (CPUs) or system-on-chips (SoCs). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems. The semiconductor packages may be applicable to internet of things (IoT).

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 is a cross-sectional view, illustrating a semiconductor package 10, according to an embodiment.

Referring FIG. 1, the semiconductor package 10 may be configured to include an interconnection layer 100, a base module 200, a lower module 300, and an upper module 400. An uppermost module 500 may be additionally stacked on the upper module 400.

The base module 200 may be disposed on the interconnection layer 100. The lower module 300 and the upper module 400 may be sequentially and vertically stacked on the base module 200. The upper module 400 may be stacked on the lower module 300 to be laterally offset, relative to the lower module 300. The upper module 400 may be laterally offset, relative to the lower module 300, producing a step-like structure. The uppermost module 500, additionally stacked on the upper module 400, may be also be laterally offset, relative to the upper module 300, in the same direction as the upper module 400 is offset from the lower module 300.

The semiconductor package 10 may further include a package encapsulant 190. The package encapsulant 190 may be formed on the base module 200 to cover and encapsulate the lower module 300, the upper module 400, and the uppermost module 500. The package encapsulant 190 may be formed by using at least one of various encapsulating materials. The package encapsulant 190 may be formed by molding an epoxy molding compound (EMC) material.

The base module 200, the lower module 300, the upper module 400, and the uppermost module 500 may constitute a unit of one sub-package or one package that is embedded in the semiconductor package 10. Each of the base module 200, the lower module 300, the upper module 400, and the uppermost module 500 may be a member that is modularized to embed a semiconductor chip. The base module 200, the lower module 300, the upper module 400, and the uppermost module 500 may be assembled or stacked to produce the semiconductor package 10. A stack structure of the base module 200, the lower module 300, the upper module 400, and the uppermost module 500 may have a configuration which is similar to a configuration of a package-on-package (PoP). The lower module 300 may be regarded as a module that is disposed under the upper module 400, and the uppermost module 500 may be regarded as a module that is disposed on the upper module 400. Another module may be additionally stacked on the uppermost module 500.

Figure 2:
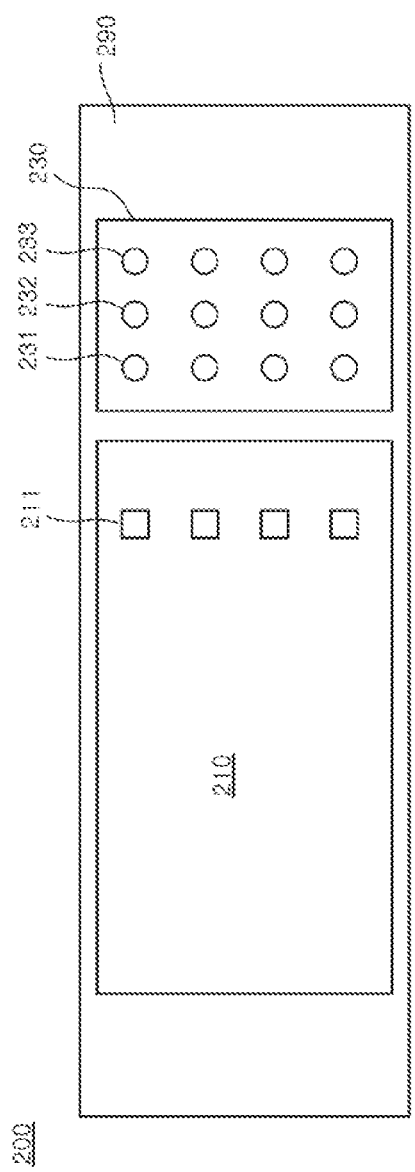
FIG. 2 is a plan view illustrating a base module included in the semiconductor package of FIG. 1.

FIG. 2 is a plan view, illustrating the base module 200, included in the semiconductor package 10 of FIG. 1.

Referring to FIGS. 1 and 2, the base module 200 may be configured to include a base semiconductor chip 210, a base interposing bridge 230, and a base encapsulant 290. The base module 200 may include the base semiconductor chip 210 and the base interposing bridge 230, encapsulated by the base encapsulant 290. The base module 200 may provide a base structure on which the lower module 300 is disposed. In addition, the base module 200 may provide a base structure that is disposed between the lower module 300 and the interconnection layer 100.

The base semiconductor chip 210 may be a memory semiconductor chip in which circuits of a memory device are integrated. The memory device may be a DRAM device. The base interposing bridge 230 may be laterally spaced apart from the base semiconductor chip 210.

The base interposing bridge 230 may correspond to a vertical connection member to electrically and vertically connect the lower module 300 to the interconnection layer 100. The base interposing bridge 230 may include first to third base through vias 231, 232, and 233 that act as vertical connectors. The base through vias 231, 232, and 233 may be conductive members that vertically penetrate a body of the base interposing bridge 230.

The base through vias 231, 232, and 233 may be through silicon vias (TSVs). The base through vias 231, 232, and 233 may be formed to include a metal material, such as a copper material or a conductive material. Because the base through vias 231, 232, and 233 may be formed using TSVs, it may be possible to increase the number of the base through vias 231, 232, and 233 that are formed in a limited planar area. The body of the base interposing bridge 230 may be a silicon die or a silicon chip.

In the base module 200, a distance between the base semiconductor chip 210 and the first base through vias 231 may be shorter than a distance between the base semiconductor chip 210 and the second base through vias 232. A distance between the base semiconductor chip 210 and the third base through vias 233 may be greater than a distance between the base semiconductor chip 210 and the second base through vias 232. In the base interposing bridge 230, the first to third base through vias 231, 232, and 233 may be electrically disconnected from each other. That is, the first to third base through vias 231, 232, and 233 may be electrically isolated or physically separated from each other.

The base encapsulant 290 may be formed to cover the base semiconductor chip 210 and the base interposing bridge 230. The base encapsulant 290 may fill a gap between the base semiconductor chip 210 and the base interposing bridge 230 and may hold the two together. The base encapsulant 290 may be molded into a shape in forming the base module 200. The base encapsulant 290 may be formed using at least one of the various encapsulating materials. For example, the base encapsulant 290 may be formed by molding an epoxy molding compound (EMC) material.

Referring to FIG. 1, the interconnection layer 100 may include conductive interconnection patterns 120. The interconnection patterns 120 may be conductive patterns that are disposed in a dielectric layer 110. The dielectric layer 110 may be formed to include at least one of the various dielectric materials. The dielectric layer 110 may be formed to include a plurality of dielectric layers that are stacked. Outer connectors 130 may be attached to the interconnection layer 100. The outer connectors 130 may be connection members that electrically connect the semiconductor package 10 to an external device or external system. The outer connectors 130 may be solder balls.

First to fourth interconnection patterns 121, 122, 123, and 124 may be disposed in the dielectric layer 110 to constitute the interconnection patterns 120. The first interconnection patterns 121 may be conductive patterns to electrically connect chip pads 211 of the base semiconductor chip 210 to first outer connectors 131 of the outer connectors 130. The second interconnection patterns 122 may be conductive patterns to electrically connect the first base through vias 231 to second outer connectors 132 of the outer connectors 130. The third interconnection patterns 123 may be conductive patterns to electrically connect the second base through vias 232 to third outer connectors 133 of the outer connectors 130. The fourth interconnection patterns 124 may be conductive patterns to electrically connect the third base through vias 233 to fourth outer connectors 134 of the outer connectors 130. The first, second, third, and fourth interconnection patterns 121, 122, 123, and 124 may provide electrical paths, independent from each other, to connect the base semiconductor chip 210 and the first to third base through vias 231, 232, and 233 to the outer connectors 130.

The interconnection layer 100 may be formed by stacking the dielectric layer 110 and the interconnection patterns 120 on the base module 200. Because the interconnection layer 100 is formed by directly stacking a plurality of layers and a plurality of patterns on the base module 200, it may be possible to form the interconnection layer 100 with a thickness that is less than a thickness of a normal printed circuit board (PCB). Because the interconnection layer 100 can be formed thinner than the PCB, the semiconductor package 10 may be relatively thinner than a normal semiconductor package with a PCB, instead of the interconnection layer 100. The interconnection layer 100 may be formed to cover a surface of the base semiconductor chip 210 and may extend to cover a surface of the base encapsulant 290. The semiconductor package 10 with the interconnection layer 100 may be regarded as having a structure of a fan-out package.

Figure 3:
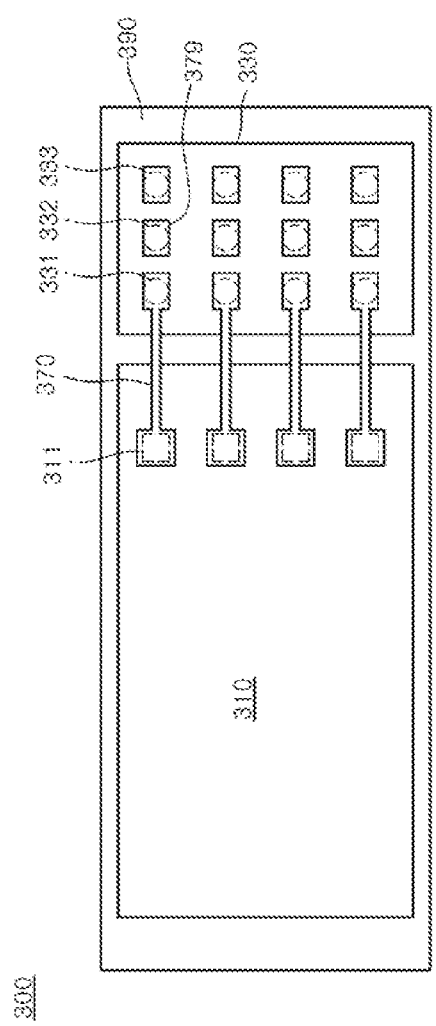
FIG. 3 is a plan view illustrating a lower module included in the semiconductor package of FIG. 1.

FIG. 3 is a plan view, illustrating the lower module 300, included in the semiconductor package 10 of FIG. 1.

Referring to FIGS. 1 and 3, the lower module 300 may be vertically stacked on the base module 200. The lower module 300 may be configured to include a lower semiconductor chip 310, a lower interposing bridge 330, and a lower encapsulant 390. The lower semiconductor chip 310 may be configured to include a memory device.

The lower interposing bridge 330 may be laterally spaced apart from the lower semiconductor chip 310. The lower interposing bridge 330 may have substantially the same configuration as the base interposing bridge 230. The lower interposing bridge 330 may correspond to a vertical connection member to electrically and vertically connect the upper module 400 to the base interposing bridge 230 of the base module 200. The lower interposing bridge 330 may include first to third lower through vias 331, 332, and 333. The lower through vias 331, 332, and 333 may be TSVs that vertically penetrate a body of the lower interposing bridge 330.

In the lower module 300, a distance between the lower semiconductor chip 310 and the first lower through vias 331 may be shorter than a distance between the lower semiconductor chip 310 and the second lower through vias 332. A distance between the lower semiconductor chip 310 and the third lower through vias 333 may be greater than a distance between the lower semiconductor chip 310 and the second lower through vias 332.

The lower encapsulant 390 may be formed to cover the lower semiconductor chip 310 and the lower interposing bridge 330. The lower encapsulant 390 may fill a gap between the lower semiconductor chip 310 and the lower interposing bridge 330 and may hold the two together. The lower encapsulant 390 may be molded to into a shape in forming the lower module 300.

The lower module 300 may further include lower redistributed lines (RDLs) 370. The lower RDLs 370 may be conductive patterns that extend to connect the lower semiconductor chip 310 to the first lower through vias 331. First ends of the lower RDLs 370 may overlap with chip pads 311 of the lower semiconductor chip 310, and second ends of the lower RDLs 370 may overlap with the first lower through vias 331. The lower RDLs 370 may be disconnected from the second and third lower through vias 332 and 333. Thus, the second and third lower through vias 332 and 333 may be electrically isolated or physically separated from the lower semiconductor chip 310. Via pads 379 may overlap with second and third lower through vias 332 and 333, respectively. The via pads 379 may be formed when the lower RDLs 370 are formed. A dielectric layer 340 may be formed to cover the lower RDLs 370 to electrically isolate the lower RDLs 370 from each other.

Referring to FIG. 1, the lower module 300 may be vertically stacked on the base module 200. The first to third lower through vias 331, 332, and 333 may overlap with the first to third base through vias 231, 232, and 233, respectively. The first to third lower through vias 331, 332, and 333 may be electrically connected to the first to third base through vias 231, 232, and 233, respectively.

Inner connectors 380 may be disposed between the lower module 300 and the base module 200 to electrically connect the lower module 300 to the base module 200. The first to third lower through vias 331, 332, and 333 may be electrically connected to the first to third base through vias 231, 232, and 233, respectively, through the inner connectors 380. A first group of the inner connectors 380 may be provided between the first base through vias 231 and the lower RDLs 370 to electrically connect the first base through vias 231 to the lower RDLs 370. Second and third groups of the inner connectors 380 may electrically connect the second and third base through vias 232 and 233 to respective one of the via pads 379. The inner connectors 380 may be connection members, such as conductive bumps. The inner connectors 380 may be bumps with a metal material, such as a copper material or a solder material.

Supporters 360 may be disposed between the lower module 300 and the base module 200 to support the lower module 300. The supporters 360 may be spaced apart from the inner connectors 380. Because the inner connectors 380 overlap with the lower interposing bridge 330 of the lower module 300, the lower module 300 may be inclined without the supporters 360. The supporters 360 may overlap with the lower semiconductor chip 310, thereby supporting the lower module 300 so that the lower module 300 maintains its horizontal balance. The supporters 360 may be attached to a surface of the dielectric layer 340 of the lower module 300. The supporters 360 may be attached to a surface of the base encapsulant 290 of the base module 200. The supporters 360 may be realized using dummy bumps that are electrically isolated from the base module 200 and the lower module 300. The supporters 360 may be formed of a metal material. Alternatively, the supporters 360 may be formed of an insulation material, such a polymer material or a resin material.

Figure 4:
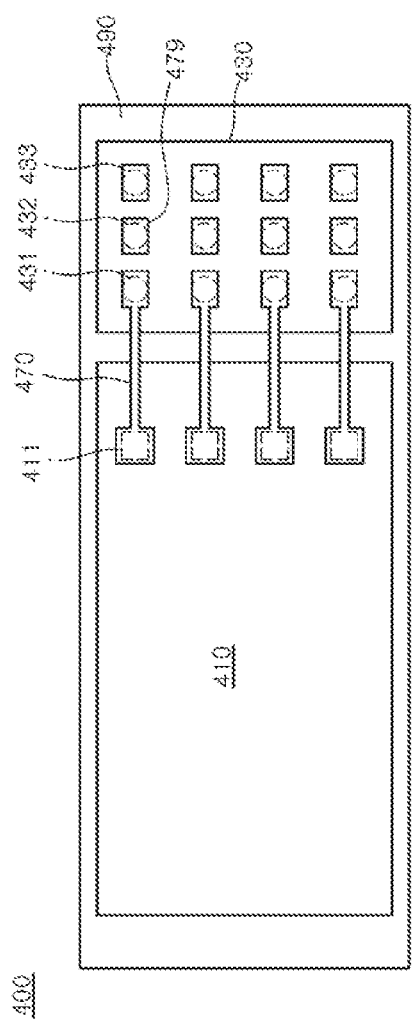
FIG. 4 is a plan view illustrating an upper module included in the semiconductor package of FIG. 1.

FIG. 4 is a plan view, illustrating the upper module 400, included in the semiconductor package 20 of FIG. 1.

Referring to FIGS. 1 and 4, the upper module 400 may be vertically stacked on the lower module 300. The upper module 400 may be configured to include an upper semiconductor chip 410, an upper interposing bridge 430, an upper encapsulant 490, and upper RDLs 470. The upper semiconductor chip 410 may be configured to include a memory device.

The upper interposing bridge 430 may be laterally spaced apart from to the upper semiconductor chip 410. The upper interposing bridge 430 may be a vertical connection member that electrically and vertically connects the uppermost module 500 to the lower interposing bridge 330 of the lower module 300. The upper interposing bridge 430 may include first to third upper through vias 431, 432, and 433. The upper through vias 431, 432, and 433 may be TSVs that vertically penetrate a body of the upper interposing bridge 430.

In the upper module 400, a distance between the upper semiconductor chip 410 and the first upper through vias 431 may be shorter than a distance between the upper semiconductor chip 410 and the second upper through vias 432. A distance between the upper semiconductor chip 410 and the third upper through vias 433 may be greater than a distance between the upper semiconductor chip 410 and the second upper through vias 432.

The upper encapsulant 490 may be formed to cover the upper semiconductor chip 410 and the upper interposing bridge 430. The upper encapsulant 490 may fill a gap between the upper semiconductor chip 410 and the upper interposing bridge 430 and may hold the two together. The upper encapsulant 490 may be molded into a shape in forming the upper module 400.

The upper RDLs 470 may be conductive patterns that extend to connect the upper semiconductor chip 410 to the first upper through vias 431. First ends of the upper RDLs 470 may overlap with chip pads 411 of the upper semiconductor chip 410, and second ends of the upper RDLs 470 may overlap with the first upper through vias 431. The upper RDLs 470 may be disconnected from the second and third upper through vias 432 and 433. Thus, the second and third upper through vias 432 and 433 may be electrically isolated or physically separated from the upper semiconductor chip 410. Via pads 479 may overlap with the second and third upper through vias 432 and 433, respectively. A dielectric layer 440 may be formed to cover the upper RDLs 470 to electrically isolate the upper RDLs 470 from each other.

Figure 5:
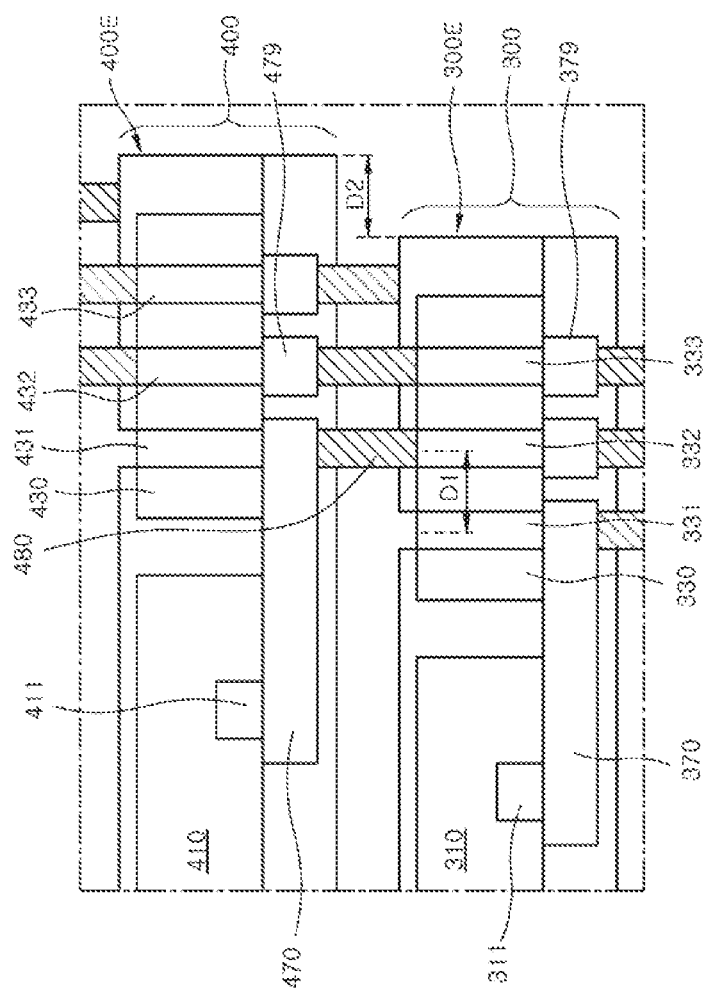
FIG. 5 is an enlarged cross-sectional view illustrating a stack portion of a lower interposing bridge and an upper interposing bridge shown in FIG. 1.

FIG. 5 is an enlarged cross-sectional view, illustrating a stack portion of the lower interposing bridge 330 and the upper interposing bridge 430, shown in FIG. 1.

Referring to FIGS. 1 and 5, the first upper through vias 431 may be located to vertically overlap with the second lower through vias 332 and may be electrically connected to the second lower through vias 332. The second upper through vias 432 may be electrically connected to the third lower through vias 333. A first group of inner connectors 480 may overlap with the first upper through vias 431 to connect the upper RDLs 470 to the second lower through vias 332. A second group of the inner connectors 480 may overlap with the second upper through vias 432 to connect some of the via pads 479 to the third lower through vias 333. Supporters 460 may be additionally disposed between the upper module 400 and the lower module 300 to support the upper module 400.

The upper module 400 may be stacked to be offset, relative to the lower module 300 such that the first upper through vias 431 vertically overlap with the second lower through vias 332. As a result, the upper module 400 may be laterally offset, relative to the lower module 300. The upper module 400 may be stacked on the lower module 300 to be laterally offset, relative to the lower module 300 by an array pitch D1 of the first lower through via 331 and the second lower through via 332, which are adjacent to each other. An offset distance D2, between the upper module 400 and the lower module 300, may be equal to the array pitch D1 of the first lower through via 331 and the second lower through via 332, which are adjacent to each other. As the upper module 400 is stacked to be offset, relative to the lower module 300, an edge portion 400E of the upper module 400 may protrude from a side surface of an edge portion 300E of the lower module 300 when viewed from a plan view.

Figure 6:
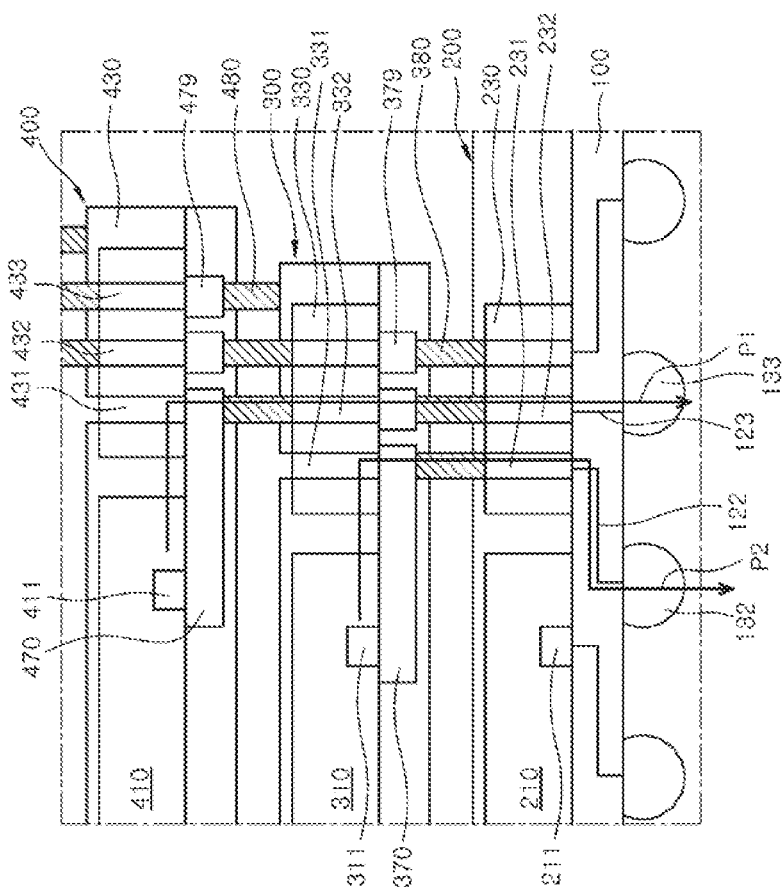
FIG. 6 is an enlarged cross-sectional view illustrating a stack portion of a base interposing bridge, a lower interposing bridge, and an upper interposing bridge shown in FIG. 1.

FIG. 6 is an enlarged cross-sectional view, illustrating a stack portion of the base interposing bridge 230, the lower interposing bridge 330, and the upper interposing bridge 430, shown in FIG. 1.

Referring to FIGS. 1 and 6, the upper module 400 may be stacked to be offset, relative to the lower module 300 to provide first electric paths P1, each of which being comprised of the chip pad 411, the upper RDL 470, the inner connector 480 of the upper module 400, the second lower through via 332, the via pad 379 of the lower module 300, the inner connector 380 of the lower module 300, the second base through via 232, the third interconnection pattern 123, and the third outer connector 133. The first electric paths P1 may electrically connect the upper module 400 to the third outer connectors 133. The first electric paths P1 may be electrically disconnected from the lower semiconductor chip 310 and the base semiconductor chip 210 to act as merely paths for electrically connecting the upper semiconductor chip 410 to the third outer connectors 133. The upper RDLs 470, the first upper through vias 431, and the second lower through vias 332 may constitute independent paths, which are electrically disconnected from the first lower through vias 331 and the lower RDLs 370.

The upper module 400 may be stacked to be offset, relative to the lower module 300 to provide second electric paths P2, each of which being comprised of the chip pad 311, the lower RDL 370, the inner connector 380 of the lower module 300, the first base through via 231, the second interconnection pattern 122, and the second outer connector 132. The second electric paths P2 may be merely paths for electrically connecting the lower module 300 to the second outer connectors 132. The second electric paths P2 may be electrically disconnected from the upper semiconductor chip 410 and the base semiconductor chip 210 to act as merely paths that electrically connect the base semiconductor chip 310 to the second outer connectors 132.

Because the first electric paths P1 are configured to be independent from the second electric paths P2, it may be possible to independently apply different data signals to the upper semiconductor chip 410 and the lower semiconductor chip 310 through the first and second electric paths P1 and P2. If the first electric paths P1 are electrically connected to the second electric paths P2, an operation may be required to distinguish the upper and lower semiconductor chips 410 and 310 from each other to apply the data signals to only one of the upper and lower semiconductor chips 410 and 310. That is, a chip selection logic circuit that generates a chip selection signal may be additionally required to select one of the upper and lower semiconductor chips 410 and 310, while the data signals are transmitted through the first and second electric paths P1 and P2, which are electrically connected to each other.

According to the semiconductor package 10, no chip selection logic circuit is required. Because the upper and lower semiconductor chips 410 and 310 independently communicate with an external system or another external module through the first and second electric paths P1 and P2, which are independent from each other, an extra operation to select one of the upper and lower semiconductor chips 410 and 310 is not required while the semiconductor package operates.

Referring again to FIGS. 1, 3, and 4, the upper module 400 may be configured to have substantially the same configuration as the lower module 300. The upper semiconductor chip 410, the upper interposing bridge 430, and the upper RDLs 470, constituting the upper module 400, may have substantially the same configurations as the lower semiconductor chip 310, the lower interposing bridge 330, and the lower RDLs 370, constituting the lower module 300, respectively. That is, the upper module 400 and the lower module 300 may have substantially the same configuration.

Referring again to FIG. 1, the uppermost module 500 may be stacked on the upper module 400 to be offset, relative to the upper module 400. The uppermost module 500 may also have substantially the same configuration as the lower module 300. The uppermost module 500 may also have substantially the same configuration as the upper module 400.

Figure 7:
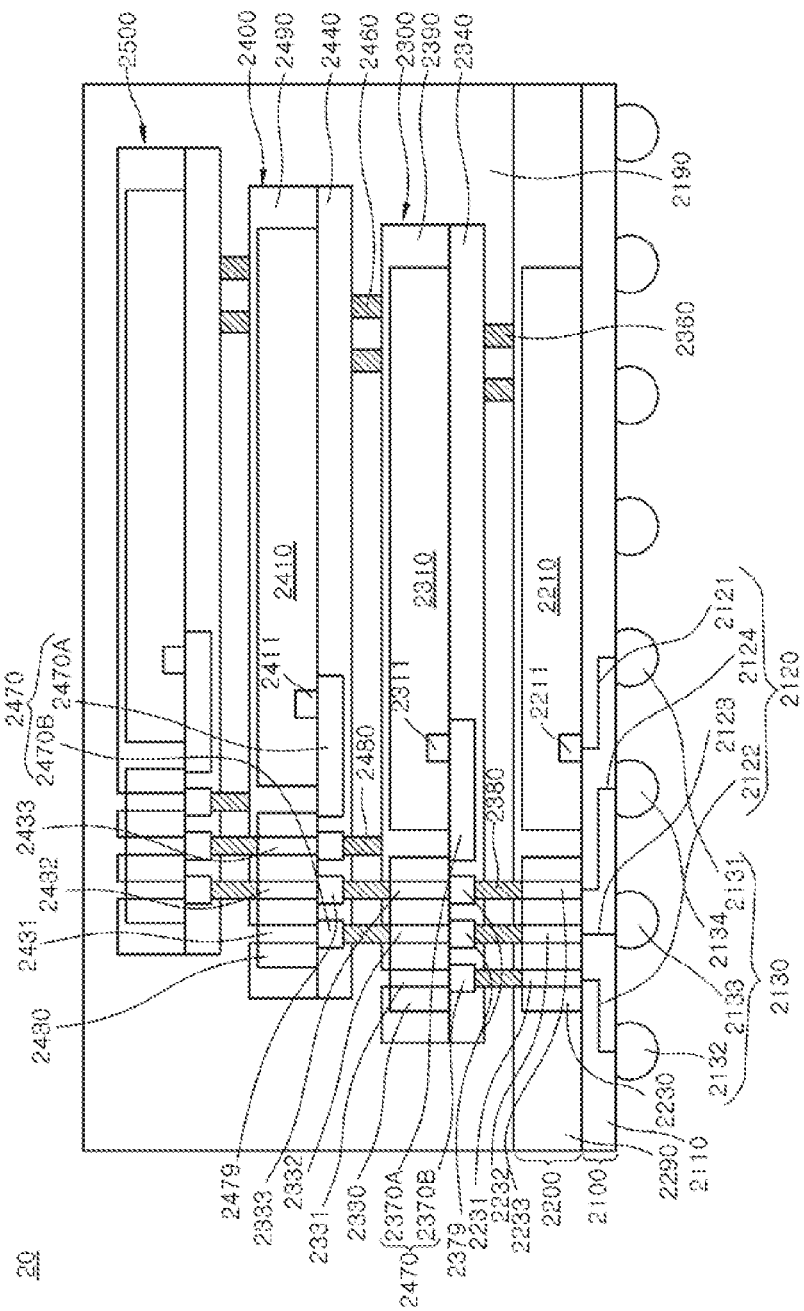
FIG. 7 is a cross-sectional view illustrating a semiconductor package according to another embodiment.

FIG. 7 is a cross-sectional view, illustrating a semiconductor package 20, according to another embodiment.

Referring to FIG. 7, the semiconductor package 20 may be configured to include an interconnection layer 2100, a base module 2200, a lower module 2300, an upper module 2400, an uppermost module 2500, and a package encapsulant 2190. The upper module 2400 may be stacked on the lower module 2300 to be offset, relative to the lower module 2300.

Figure 8:
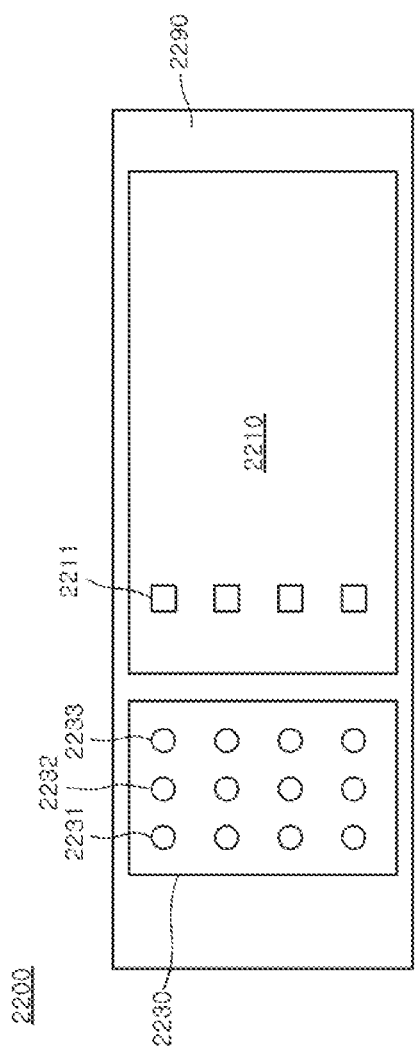
FIG. 8 is a plan view illustrating a base module included in the semiconductor package of FIG. 7.

FIG. 8 is a plan view, illustrating the base module 2200, included in the semiconductor package 20 of FIG. 7.

Referring to FIGS. 7 and 8, the base module 2200 may be configured to include a base semiconductor chip 2210, a base interposing bridge 2230, and a base encapsulant 2290. The base interposing bridge 2230 may include first to third base through vias 2231, 2232, and 2233 that are arrayed in a body of the base interposing bridge 2230. A distance between the base semiconductor chip 2210 and the first base through vias 2231 may be greater than a distance between the base semiconductor chip 2210 and the second base through vias 2232. A distance between the base semiconductor chip 2210 and the third base through vias 2233 may be shorter than a distance between the base semiconductor chip 2210 and the second base through vias 2232.

Referring again to FIG. 7, the interconnection layer 2100 may include a dielectric layer 2110 and conductive interconnection patterns 2120 that are disposed in the dielectric layer 2110. Outer connectors 2130 may be attached to the interconnection layer 2100. First interconnection patterns 2121 of the interconnection patterns 2120 may be conductive patterns, electrically connecting chip pads 2211 of the base semiconductor chip 2210 to first outer connectors 2131 of the outer connectors 2130. Second interconnection patterns 2122 of the interconnection patterns 2120 may be conductive patterns, electrically connecting the first base through vias 2231 to second outer connectors 2132 of the outer connectors 2130. Third interconnection patterns 2123 of the interconnection patterns 2120 may electrically connect the second base through vias 2232 to third outer connectors 2133 of the outer connectors 2130. Fourth interconnection patterns 2124 of the interconnection patterns 2120 may electrically connect the third base through vias 2233 to fourth outer connectors 2134 of the outer connectors 2130.

Figure 9:
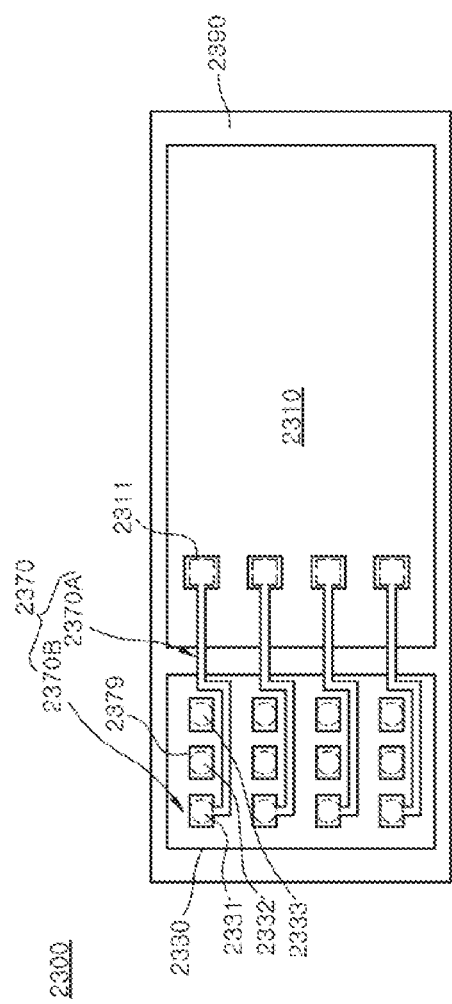
FIG. 9 is a plan view illustrating a lower module included in the semiconductor package of FIG. 7.

FIG. 9 is a plan view, illustrating the lower module 2300, included in the semiconductor package 20 of FIG. 7.

Referring to FIGS. 7 and 8, the lower module 2300 may be configured to include a lower semiconductor chip 2310, a lower interposing bridge 2330, a lower encapsulant 2390, and lower RDLs 2370. The lower interposing bridge 2330 may include first to third lower through vias 2331, 2332, and 2333 that are arrayed in a body of the lower interposing bridge 2330. A distance between the lower semiconductor chip 2310 and the second lower through vias 2332 may be shorter than a distance between the lower semiconductor chip 2310 and the first lower through vias 2331. Furthermore, a distance between the lower semiconductor chip 2310 and the third lower through vias 2333 may be shorter than a distance between the lower semiconductor chip 2310 and the second lower through vias 2332.

The lower RDLs 2370 may be conductive patterns that extend to connect chip pads 2311 of the lower semiconductor chip 2310 to the first lower through vias 2331. Each of the lower RDLs 2370 may be a conductive pattern with an overlap portion 2370B that overlaps with any one of the first lower through vias 2331 and an extension portion 2370A, connecting the overlap portion 2370B to any one of the chip pads 2311. The extension portions 2370A of the lower RDLs 2370 may extend to bypass the second and third lower through vias 2332 and 2333, as illustrated in FIG. 9. The lower RDLs 2370 may be conductive patterns that electrically connect the first lower through vias 2331 to the lower semiconductor chip 2310 and that are electrically disconnected from the second and third lower through vias 2332 and 2333. Thus, the second and third lower through vias 2332 and 2333 may be electrically isolated or insulated from the lower semiconductor chip 2310.

Via pads 2379 may overlap with the second and third lower through vias 2332 and 2333, respectively. A dielectric layer 2340 may cover the lower RDLs 2370 to electrically isolate or insulate the lower RDLs 2370 from each other.

Referring to FIG. 7, the first to third lower through vias 2331, 2332, and 2333 may overlap with the first to third base through vias 2231, 2232, and 2233, respectively. The lower module 2300 may be vertically stacked on the base module 2200, such that the first to third lower through vias 2331, 2332, and 2333 may be electrically connected to the first to third base through vias 2231, 2232, and 2233, respectively. Inner connectors 2380 may be disposed between the lower interposing bridge 2330 and the base interposing bridge 2230 to electrically connect the lower RDLs 2370 to the first base through vias 2231 and to electrically connect the via pads 2379 to the second and third base through vias 2232 and 2233. The first to third lower through vias 2331, 2332, and 2333 may be electrically connected to the first to third base through vias 2231, 2232, and 2233, respectively, by the inner connectors 2380. Supporters 2360 may be additionally disposed between the lower module 2300 and the base module 2200 to support the lower module 2300.

Figure 10:
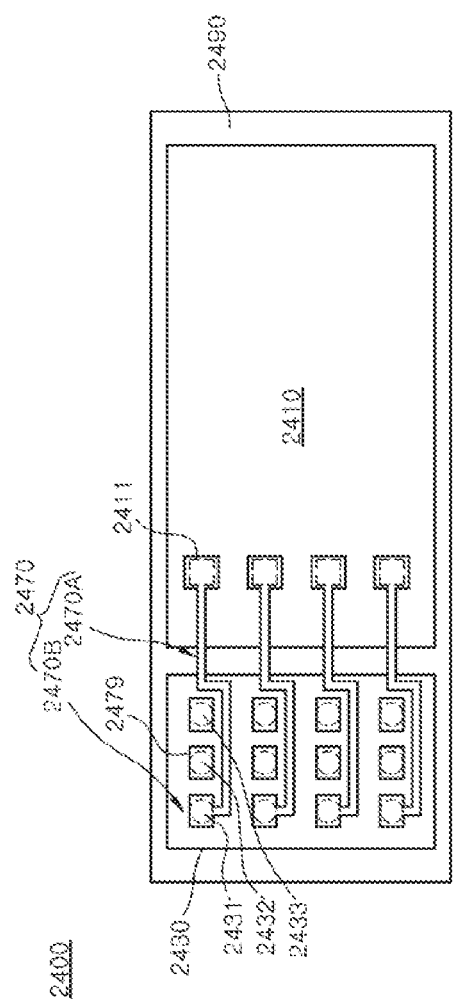
FIG. 10 is a plan view illustrating an upper module included in the semiconductor package of FIG. 7.

FIG. 10 is a plan view, illustrating the upper module 2400, included in the semiconductor package 20 of FIG. 7.

Referring to FIGS. 7 and 10, the upper module 2400 may be stacked on the lower module 2300 to be offset, relative to the lower module 2300. The upper module 2400 may have substantially the same configuration and shape as the lower module 2300. The upper module 2400 may be configured to include an upper semiconductor chip 2410, an upper interposing bridge 2430, an upper encapsulant 2490, and upper RDLs 2470. The upper interposing bridge 2430 may include first to third upper through vias 2431, 2432, and 2433 that are arrayed in a body of the upper interposing bridge 2430. A distance between the upper semiconductor chip 2410 and the second upper through vias 2432 may be shorter than a distance between the upper semiconductor chip 2410 and the first upper through vias 2431. Furthermore, a distance between the upper semiconductor chip 2410 and the third upper through vias 2433 may be shorter than a distance between the upper semiconductor chip 2410 and the second upper through vias 2432.

The upper RDLs 2470 may be conductive patterns that extend to connect chip pads 2411 of the upper semiconductor chip 2410 to the first upper through vias 2431. Each of the upper RDLs 2470 may be a conductive pattern with an overlap portion 2470B that overlaps with any one of the first upper through vias 2431 and an extension portion 2470A that connects the overlap portion 2470B to any one of the chip pads 2411. The extension portions 2470A of the upper RDLs 2470 may extend to bypass the second and third upper through vias 2432 and 2433, as illustrated in FIG. 10. The upper RDLs 2470 may be conductive patterns that electrically connect the first upper through vias 2431 to the upper semiconductor chip 2410 and that are electrically disconnected from the second and third upper through vias 2432 and 2433. Thus, the second and third upper through vias 2432 and 2433 may be electrically isolated or insulated from the upper semiconductor chip 2410.

Via pads 2379 may overlap with the second and third upper through vias 2432 and 2433, respectively. A dielectric layer 2440 may cover the upper RDLs 2470 to electrically isolate or insulate the upper RDLs 2470 from each other.

Referring to FIG. 7, the upper module 2400 may be stacked on the lower module 2300 to be laterally offset, relative to the lower module 2300 by an array pitch of the first lower through via 2331 and the second lower through via 2332, which are adjacent to each other. Thus, the first upper through vias 2431 may vertically overlap with the second lower through vias 2332. The first upper through vias 2431 may be electrically connected to the second lower through vias 2332, and the second upper through vias 2432 may be electrically connected to the third lower through vias 2333. A first group of inner connectors 2480 may overlap with the first upper through vias 2431 to connect the upper RDLs 2470 to the second lower through vias 2332. A second group of the inner connectors 2480 may overlap with the second upper through vias 2432 to connect some of the via pads 2479 to the third lower through vias 2333. Supporters 2460 may be additionally disposed between the upper module 2400 and the lower module 2300 to support the upper module 2400.

Referring to FIGS. 1, 9, and 10, the upper module 2400 may be stacked to be offset, relative to the lower module 2300 to provide first electric paths, each of which being comprised of the chip pad 2411, the upper RDL 2470, the inner connector 2480 of the upper module 2400, the second lower through via 2332, the via pad 2379 of the lower module 2300, the inner connector 2380 of the lower module 2300, the second base through via 2232, the third interconnection pattern 2123, and the third outer connector 2133.

Moreover, the upper module 2400 may be stacked to be offset, relative to the lower module 2300 to provide second electric paths, each of which being comprised of the chip pad 2311, the lower RDL 2370, the inner connector 2380 of the lower module 2300, the first base through via 2231, the second interconnection pattern 2122, and the second outer connector 2132. Because the first electric paths are configured to be independent from the second electric paths, it may be possible to independently apply different data signals to the upper semiconductor chip 2410 and the lower semiconductor chip 2310 through the first and second electric paths.

The uppermost module 2500 may be stacked on the upper module 2400 to be offset, relative to the upper module 2400. The uppermost module 2500 may also have substantially the same configuration as the lower module 2300 or the upper module 2400.

Figure 11:
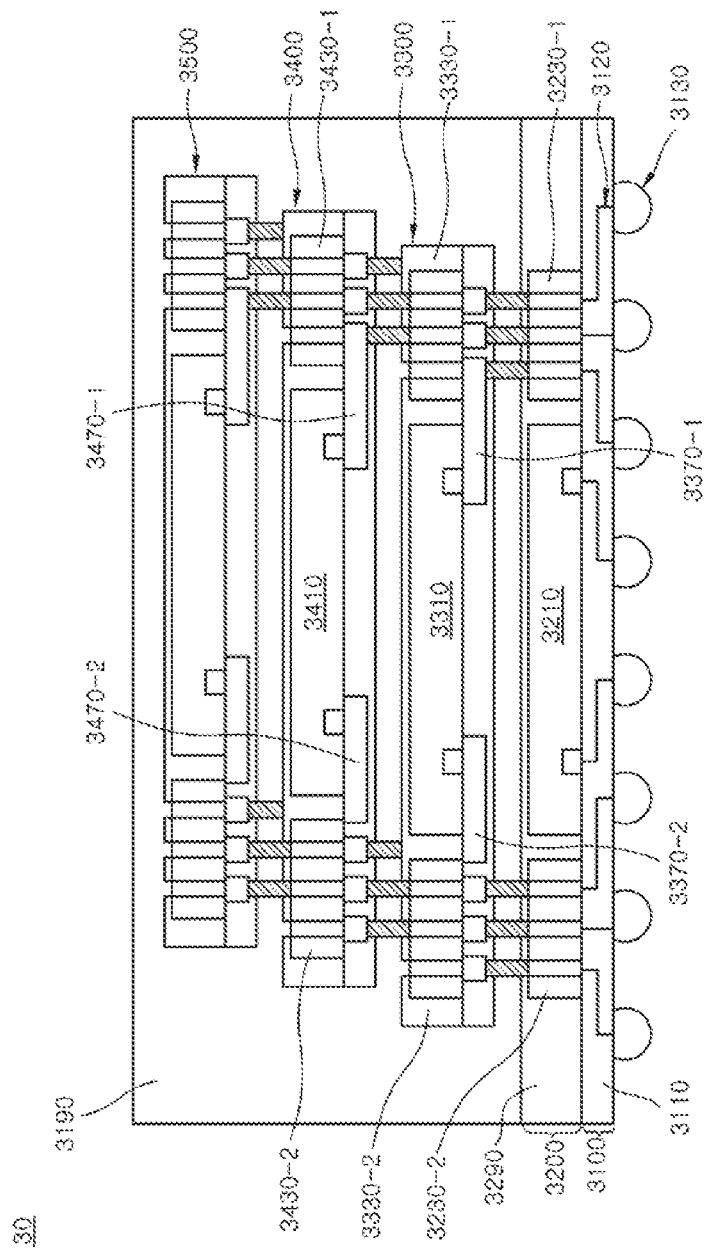
FIG. 11 is a cross-sectional view illustrating a semiconductor package according to yet another embodiment.

FIG. 11 is a cross-sectional view, illustrating a semiconductor package 30, according to yet another embodiment.

Referring to FIG. 11, the semiconductor package 30 may be configured to include an interconnection layer 3100, a base module 3200, a lower module 3300, an upper module 3400, an uppermost module 3500, and a package encapsulant 3190. The upper module 3400 may be stacked on the lower module 3300 to be offset, relative to the lower module 3300.

Figure 12:
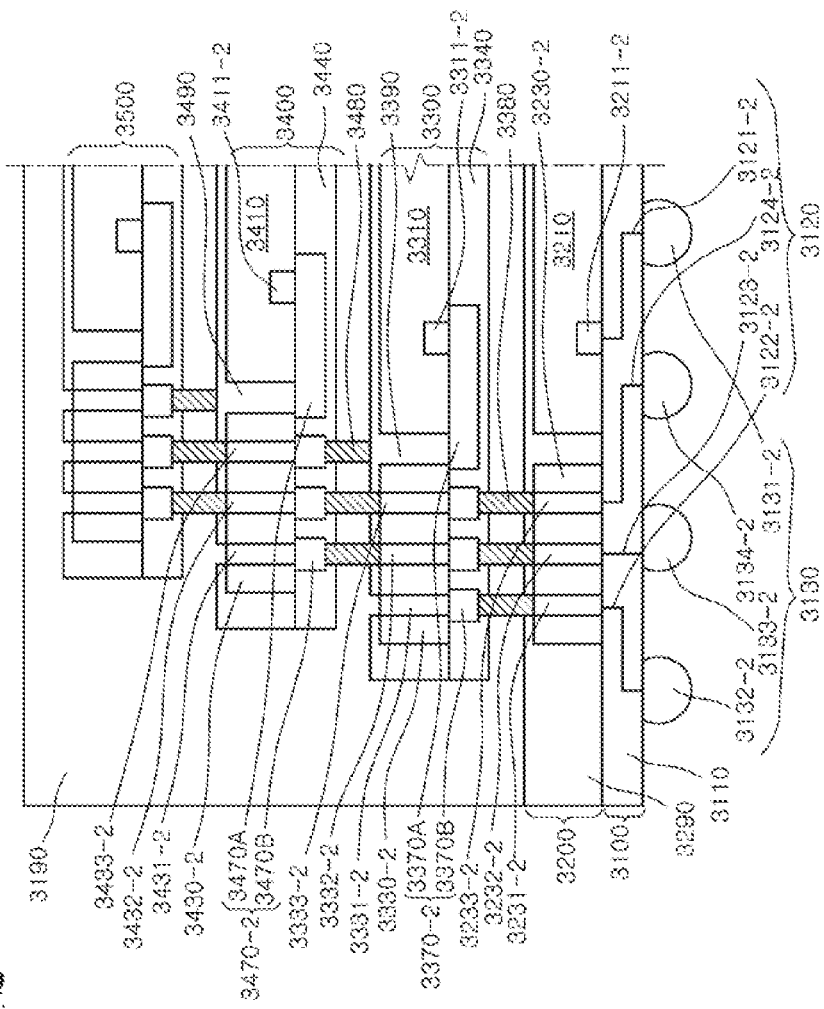
FIGS. 12 and 13 are enlarged cross-sectional views illustrating portions of the semiconductor package shown in FIG. 11.
Figure 13:
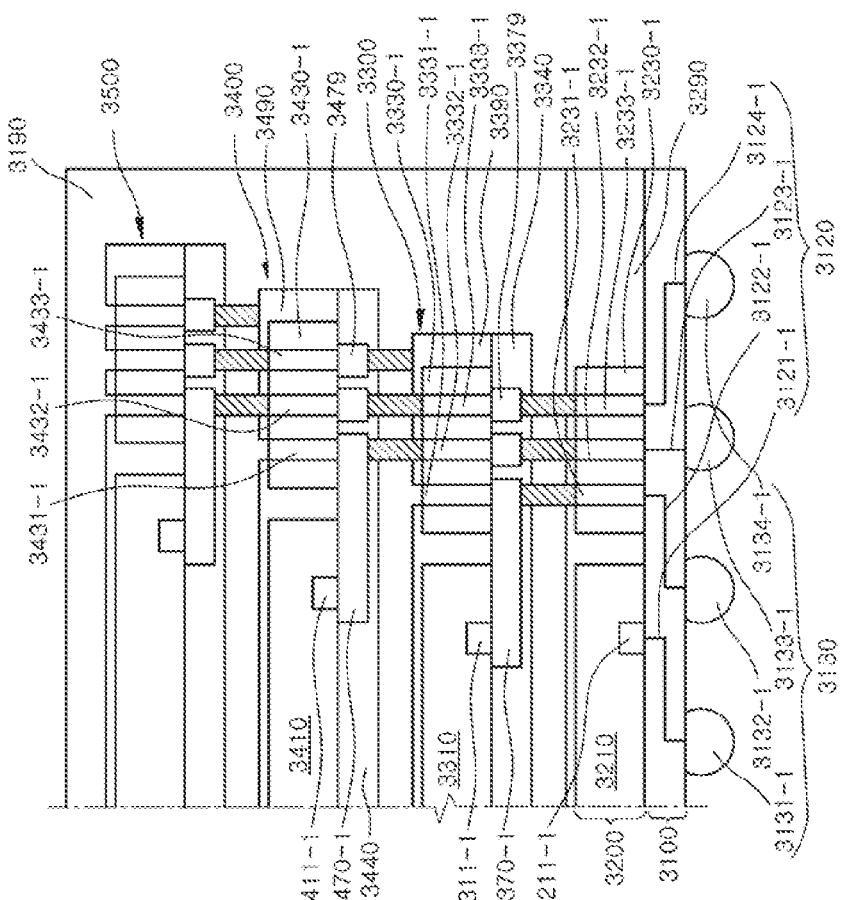
Figure 14:
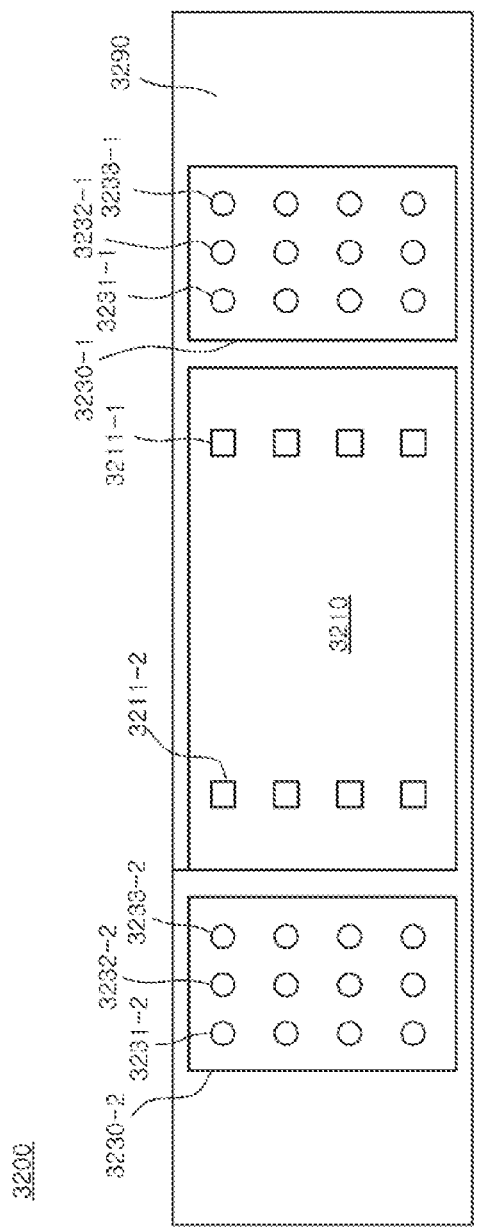
FIG. 14 is a plan view illustrating a base module included in the semiconductor package of FIG. 11.

FIG. 12 is an enlarged cross-sectional view, illustrating a left-half side of the semiconductor package 30, shown in FIG. 11. FIG. 13 is an enlarged cross-sectional view, illustrating a right-half side of the semiconductor package 30, shown in FIG. 11. FIG. 14 is a plan view, illustrating the base module 3200, included in the semiconductor package 30 of FIG. 11.

Referring to FIGS. 11, 13, and 14, the base module 3200 may be stacked on the interconnection layer 3100 and may be configured to include a base semiconductor chip 3210, a first base interposing bridge 3230-1, a second base interposing bridge 3230-2, and a base encapsulant 3290.

The first base interposing bridge 3230-1 may be laterally spaced from a side of the base semiconductor chip 3210. The first base interposing bridge 3230-1 may include first, second, and fifth base through vias 3231-1, 3232-1, and 3233-1 that are arrayed in a body of the first base interposing bridge 3230. The first base interposing bridge 3230-1 may have substantially the same configuration as the base interposing bridge 230 that is illustrate in FIG. 1. A distance between the base semiconductor chip 3210 and the first base through vias 3231-1 may be shorter than a distance between the base semiconductor chip 3210 and the second base through vias 3232-1. Furthermore, a distance between the base semiconductor chip 3210 and the fifth base through vias 3233-1 may be greater than a distance between the base semiconductor chip 3210 and the second base through vias 3232-1.

The second base interposing bridge 3230-2 may be laterally spaced from another side of the base semiconductor chip 3210 0, the opposing side to the first base interposing bridge 3230-1. The second base interposing bridge 3230-2 may include second, third, and sixth base through vias 3231-2, 3232-2, and 3233-2 that are arrayed in a body of the second base interposing bridge 3230-2. The second base interposing bridge 3230-2 may have substantially the same configuration as the base interposing bridge 2230 that is illustrated in FIG. 7. A distance between the base semiconductor chip 3210 and the third base through vias 3231-2 may be greater than a distance between the base semiconductor chip 3210 and the fourth base through vias 3232-2. Furthermore, a distance between the base semiconductor chip 3210 and the sixth base through vias 3233-2 may be shorter than a distance between the base semiconductor chip 3210 and the fourth base through vias 3232-2.

Referring again to FIGS. 11, 12, and 13, the interconnection layer 3100 may include a dielectric layer 3110 and conductive interconnection patterns 3120, the conductive interconnection patterns 3120 being disposed in the dielectric layer 3110. Outer connectors 3130 may be attached to the interconnection layer 3100. First interconnection patterns 3121-1 of the interconnection patterns 3120 may electrically connect first base chip pads 3211-1 of the base semiconductor chip 3210 to first outer connectors 3131-1 of the outer connectors 3130. Fifth interconnection patterns 3121-2 of the interconnection patterns 3120 may electrically connect second base chip pads 3211-2 of the base semiconductor chip 3210 to fifth outer connectors 3131-2 of the outer connectors 3130. Second interconnection patterns 3122-1 of the interconnection patterns 3120 may electrically connect the first base through vias 3231-1 to second outer connectors 3132-1 of the outer connectors 3130. Sixth interconnection patterns 3122-2 of the interconnection patterns 3120 may electrically connect the third base through vias 3231-2 to sixth outer connectors 3132-2 of the outer connectors 3130. Third interconnection patterns 3123-1 of the interconnection patterns 3120 may electrically connect the second base through vias 3232-1 to third outer connectors 3133-1 of the outer connectors 3130. Seventh interconnection patterns 3123-2 of the interconnection patterns 3120 may electrically connect the fourth base through vias 3232-2 to seventh outer connectors 3133-2 of the outer connectors 3130. Fourth interconnection patterns 3124-1 of the interconnection patterns 3120 may electrically connect the fifth base through vias 3233-1 to fourth outer connectors 3134-1 of the outer connectors 3130, Eighth interconnection patterns 3124-2 of the interconnection patterns 3120 may electrically connect the sixth base through vias 3233-2 to eighth outer connectors 3134-2 of the outer connectors 3130.

Figure 15:
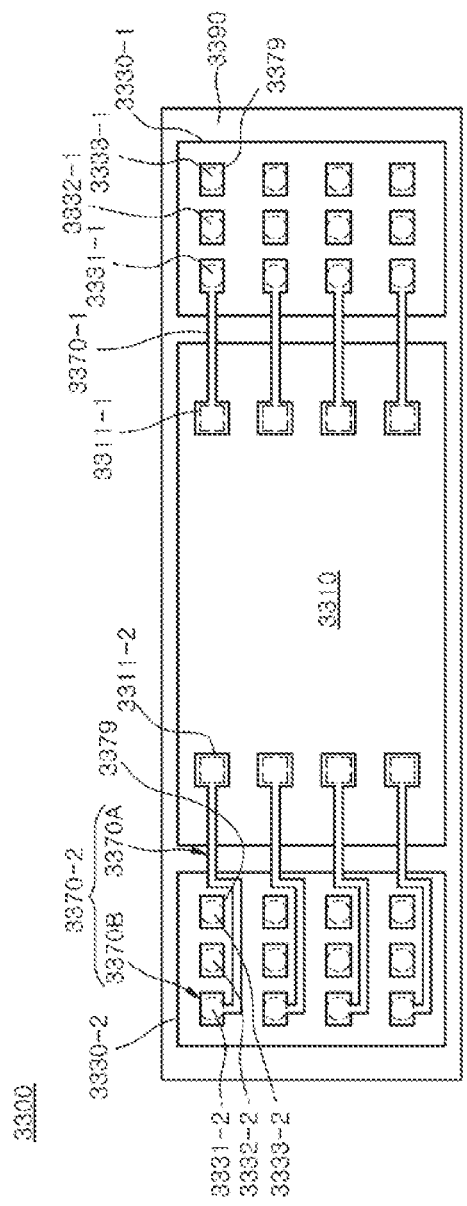
FIG. 15 is a plan view illustrating a lower module included in the semiconductor package of FIG. 11.

FIG. 15 is a plan view, illustrating the lower module 3300, included in the semiconductor package 30 of FIG. 11.

Referring to FIGS. 11, 13, and 15, the lower module 3300 may be configured to include a lower semiconductor chip 3310, a first lower interposing bridge 3330-1, a second lower interposing bridge 3330-2, a lower encapsulant 3390, first lower RDLs 3370-1, and second lower RDLs 3370-2.

The first lower interposing bridge 3330-1 may be laterally spaced from a side of the lower semiconductor chip 3310. The first lower interposing bridge 3330-1 may include first, second, and fifth lower through vias 3331-1, 3332-1, and 3333-1 that are arrayed in a body of the first lower interposing bridge 3330-1. The first lower interposing bridge 3330-1 may have substantially the same configuration as the lower interposing bridge 330 that is illustrated in FIG. 1. A distance between the lower semiconductor chip 3310 and the second lower through vias 3332-1 may be greater than a distance between the lower semiconductor chip 3310 and the first lower through vias 3331-1. Furthermore, a distance between the lower semiconductor chip 3310 and the fifth lower through vias 3333-1 may be greater than a distance between the lower semiconductor chip 3310 and the second lower through vias 3332-1.

The second lower interposing bridge 3330-2 may be laterally spaced from another side of the lower semiconductor chip 3310, the opposing side to the first lower interposing bridge 3330-1. The second lower interposing bridge 3330-2 may include third, fourth, and sixth lower through vias 3331-2, 3332-2, and 3333-2 that are arrayed in a body of the second lower interposing bridge 3330-2. The second lower interposing bridge 3330-2 may have substantially the same configuration as the lower interposing bridge 2330 that is illustrated in FIG. 7. A distance between the lower semiconductor chip 3310 and the fourth lower through vias 3332-2 may be shorter than a distance between the lower semiconductor chip 3310 and the third lower through vias 3331-2. Furthermore, a distance between the lower semiconductor chip 3310 and the sixth lower through vias 3333-2 may be shorter than a distance between the lower semiconductor chip 3310 and the fourth lower through vias 3332-2.

The first lower RDLs 3370-1 may be conductive patterns that extend to connect first chip pads 3311-1 of the lower semiconductor chip 3310 to the first lower through vias 3331-1. Because the second and fifth lower through vias 3332-1 and 3333-1 are disconnected from the first lower RDLs 3370-1, the second and fifth lower through vias 3332-1 and 3333-1 may be electrically isolated or insulated from the lower semiconductor chip 3310.

The second lower RDLs 3370-2 may be conductive patterns that extend to connect second chip pads 3311-2 of the lower semiconductor chip 3310 to the third lower through vias 3331-2. Each of the second lower RDLs 3370-2 may be a conductive pattern with an overlap portion 3370B that overlaps with any one of the third lower through vias 3331-2 and an extension portion 3370A, connecting the overlap portion 3370B to any one of the second chip pads 3311-2. The extension portions 3370A of the second lower RDLs 3370-2 may extend to bypass the fourth and sixth lower through vias 3332-2 and 3333-2, as illustrated in FIG. 15. The second lower RDLs 3370-2 may be conductive patterns that electrically connect the third lower through vias 3331-1 to the lower semiconductor chip 3310 and that are electrically disconnected from the fourth and sixth lower through vias 3332-2 and 3333-2. Thus, the fourth and sixth lower through vias 3332-2 and 3333-2 may be electrically isolated or insulated from the lower semiconductor chip 3310.

Via pads 3379 may overlap with the second, fifth, fourth, and sixth lower through vias 3332-1, 3333-1, 3332-2, and 3333-2, respectively. The via pads 3379 may be formed when the first and second lower RDLs 3370-1 and 3370-2 are formed. A dielectric layer 3340 may cover the lower RDLs 3370-1 and 3370-2 to electrically isolate or insulate the lower RDLs 3370-1 and 3370-2 from each other.

The lower module 3300 may be vertically stacked on the base module 3200 such that the first, second, fifth, third, fourth, and sixth lower through vias 3331-1, 3332-1, 3333-1, 3331-2, 3332-2, and 3333-2 overlap with the first, second, fifth, third, fourth, and sixth base through vias 3231-1, 3232-1, 3233-1, 3231-2, 3232-2, and 3233-2, respectively, and are electrically connected to the first, second, fifth, third, fourth, and sixth base through vias 3231-1, 3232-1, 3233-1, 3231-2, 3232-2, and 3233-2, respectively. Some of the inner connectors 3380 may be disposed between the lower module 3300 and the base module 3200 to electrically connect the first lower RDLs 3370-1 to the first base through vias 3231-1 and to electrically connect some of the via pads 3379 to the second and fifth base through vias 3232-1 and 3233-1. The rest of the inner connectors 3380 may be disposed between the lower module 3300 and the base module 3200 to electrically connect the second lower RDLs 3370-2 to the third base through vias 3231-2 and to electrically connect the others of the via pads 3379 to the fourth and sixth base through vias 3232-2 and 3233-2.

Figure 16:
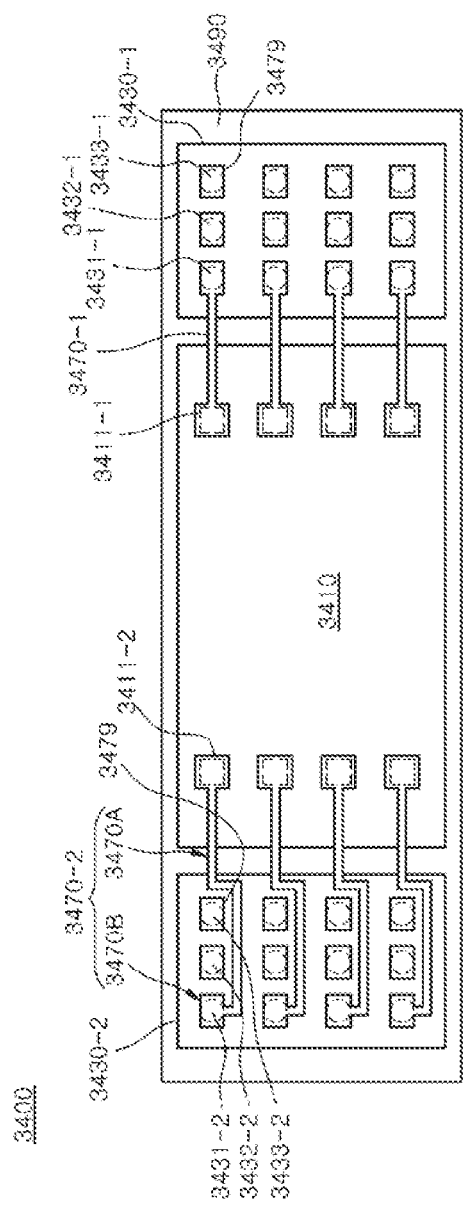
FIG. 16 is a plan view illustrating an upper module included in the semiconductor package of FIG. 11.

FIG. 16 is a plan view, illustrating the upper module 3400, included in the semiconductor package 30 of FIG. 11.

Referring to FIGS. 11, 13, and 16, the upper module 3400 may be configured to include an upper semiconductor chip 3410, a first upper interposing bridge 3430-1, a second upper interposing bridge 3430-2, an upper encapsulant 3490, first upper RDLs 3470-1, and second upper RDLs 3470-2.

The upper module 3400 may have substantially the same configuration as the lower module 3300. The upper semiconductor chip 3410, the first and second upper interposing bridges 3430-1 and 3430-2, and the first and second upper RDLs 3470-1 and 3470-2, constituting the upper module 3400, may have substantially the same configurations as the lower semiconductor chip 3310, the first and second lower interposing bridges 3330-1 and 3330-2, and the first and second lower RDLs 3370-1 and 3370-2, constituting the lower module 3300, respectively.

The first upper interposing bridge 3430-1 may be laterally spaced apart from a side of the upper semiconductor chip 3410. The first upper interposing bridge 3430-1 may include first, second, and fifth upper through vias 3431-1, 3432-1, and 3433-1 that are arrayed in a body of the first upper interposing bridge 3430-1. The first upper interposing bridge 3430-1 may have substantially the same configuration as the upper interposing bridge 340 that is illustrated in FIG. 1. A distance between the upper semiconductor chip 3410 and the second upper through vias 3432-1 may be greater than a distance between the upper semiconductor chip 3410 and the first upper through vias 3431-1. Furthermore, a distance between the upper semiconductor chip 3410 and the fifth upper through vias 3433-1 may be greater than a distance between the upper semiconductor chip 3410 and the second upper through vias 3432-1.

The second upper interposing bridge 3430-2 may be laterally spaced apart from another side of the upper semiconductor chip 3410, the opposing side to the first upper interposing bridge 3430-1. The second upper interposing bridge 3430-2 may include third, fourth, and sixth upper through vias 3431-2, 3432-2, and 3433-2 that are arrayed in a body of the second upper interposing bridge 3430-2. The second upper interposing bridge 3430-2 may have substantially the same configuration as the upper interposing bridge 2430 that is illustrated in FIG. 7. A distance between the upper semiconductor chip 3410 and the fourth upper through vias 3432-2 may be shorter than a distance between the upper semiconductor chip 3410 and the third upper through vias 3431-2. Furthermore, a distance between the upper semiconductor chip 3410 and the sixth upper through vias 3433-2 may be shorter than a distance between the upper semiconductor chip 3410 and the fourth upper through vias 3432-2.

The first upper RDLs 3470-1 may be conductive patterns that extend to connect first chip pads 3411-1 of the upper semiconductor chip 3410 to the first upper through vias 3431-1.

The second upper RDLs 3470-2 may be conductive patterns that extend to connect second chip pads 3411-2 of the upper semiconductor chip 3410 to the third upper through vias 3431-2. Each of the second upper RDLs 3470-2 may be a conductive pattern with an overlap portion 3370B that overlaps with any one of the third upper through vias 3431-2 and an extension portion 3470A, connecting the overlap portion 3470B to any one of the second chip pads 3411-2. The extension portions 3470A of the second upper RDLs 3470-2 may extend to bypass the fourth and sixth upper through vias 3432-2 and 3433-2, as illustrated in FIG. 16.

Via pads 3479 may overlap with the second, fifth, fourth and sixth upper through vias 3432-1, 3433-1, 3432-2, and 3433-2, respectively. A dielectric layer 3440 may cover the upper RDLs 3470-1 and 3470-2 to electrically isolate or insulate the upper RDLs 3470-1 and 3470-2 from each other.

Referring to FIGS. 11 and 13, the upper module 3400 may be vertically stacked on the lower module 3300 to be offset, relative to the lower module 3300 such that the first upper through vias 3431-1 vertically overlap with the second lower through vias 3332-1, respectively, to be electrically connected to the second lower through vias 3332-1, respectively, and the third upper through vias 3431-2 vertically overlap with the fourth lower through vias 3332-2, respectively, to be electrically connected to the fourth lower through vias 3332-2, respectively. The upper module 3400 may be stacked on the lower module 3300 to be laterally offset, relative to the lower module 3300 by an array pitch of the first lower through via 3331-1 and the second lower through via 3332-1, which are adjacent to each other.

The uppermost module 3500 may be stacked on the upper module 3400 to be offset, relative to the upper module 3400. The uppermost module 3500 may also have substantially the same configuration as the lower module 3300 or the upper module 3400.

The upper module 3400 and the lower module 3300 may be independently connected to the outer connector 3130 through different electrical paths. For example, as illustrated in FIG. 13, there may be first electric paths, each of which being comprised of the first chip pad 3411-1 of the upper semiconductor chip 3410, the first upper RDL 3470-1, the inner connector 3480 of the upper module 3400, the second lower through via 3332-1, the via pad 3379 of the lower module 3300, the inner connector 3380 of the lower module 3300, the second base through via 3232-1, the third interconnection pattern 3123-1, and the third outer connector 3133-1. In addition, there may be second electric paths, each of which being comprised of the first chip pad 3311-1 of the lower semiconductor chip 3310, the first lower RDL 3370-1, the inner connector 3380 of the lower module 3300, the first base through via 3231-1, the second interconnection pattern 3122-1, and the second outer connector 3132-1. Because the first electric paths are configured to be independent from the second electric paths, it may be possible to independently apply different data signals to the upper semiconductor chip 3410 and the lower semiconductor chip 3310 through the first and second electric paths.

Figure 17:
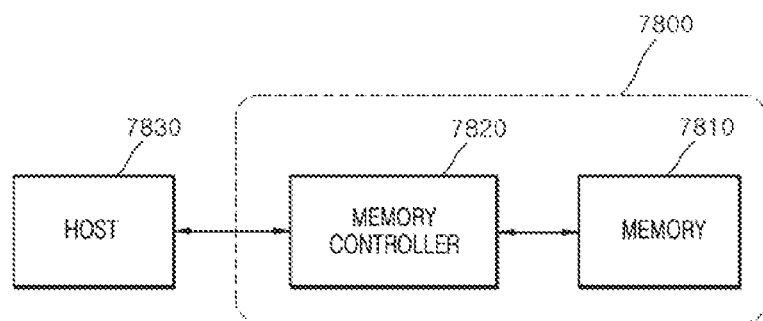
FIG. 17 is a block diagram illustrating an electronic system employing a memory card including at least one of semiconductor packages according to the embodiments.

FIG. 17 is a block diagram, illustrating an electronic system including a memory card 7800 employing at least one of the semiconductor packages, according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 18:
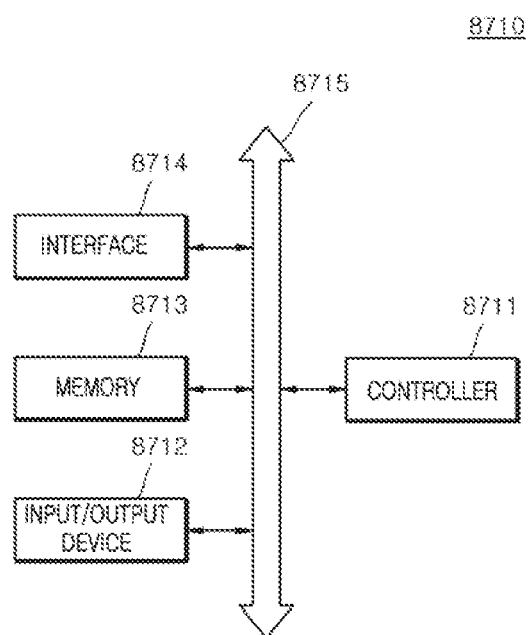
FIG. 18 is a block diagram illustrating another electronic system including at least one of semiconductor packages according to the embodiments.

FIG. 18 is a block diagram, illustrating an electronic system 8710 including at least one of the semiconductor packages, according to the embodiments. The electronic system 8710 may include a controller 8711, an input/output unit 8712, and a memory 8713. The controller 8711, the input/output unit 8712, and the memory 8713 may be coupled with one another through a bus 8715 providing a path through which data move.

In an embodiment, the controller 8711 may include one or more microprocessor, digital signal processor, microcontroller, and/or logic device capable of performing substantially the same functions as these components. The controller 8711 or the memory 8713 may include at least one of the semiconductor packages according to the embodiments of the present disclosure. The input/output unit 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor package comprising:
a lower module; and
an upper module stacked on the lower module,
wherein the lower module includes:
a lower semiconductor chip;
a lower interposing bridge spaced apart from the lower semiconductor chip and configured to include a first lower through via and a second lower through via;
a lower encapsulant encapsulating the lower semiconductor chip and the lower interposing bridge; and a lower redistributed line (RDL) extending to connect the lower semiconductor chip to the first lower through via, wherein the upper module includes:
an upper semiconductor chip;
an upper interposing bridge spaced apart from the upper semiconductor chip and configured to include a first upper through via and a second upper through via;
an upper encapsulant encapsulating the upper semiconductor chip and the upper interposing bridge; and
an upper RDL extending to connect the upper semiconductor chip to the first upper through via, and
wherein the first upper through via overlaps with the second lower through via.

2. The semiconductor package of claim 1, wherein the upper module has substantially the same configuration as the lower module.

3. The semiconductor package of claim 2,
wherein the upper semiconductor chip has substantially the same configuration as the lower semiconductor chip;
wherein the upper interposing bridge has substantially the same configuration as the lower interposing bridge; and
wherein the upper RDL has substantially the same shape as the lower RDL.

4. The semiconductor package of claim 3, wherein the upper module is laterally offset, relative to the lower module by an array pitch of the first and second lower through vias.

5. The semiconductor package of claim 1,
wherein a distance between the first upper through via and the upper semiconductor chip is shorter than a distance between the second upper through via and the upper semiconductor chip; and
wherein a distance between the first lower through via and the lower semiconductor chip is shorter than a distance between the second lower through via and the lower semiconductor chip.

6. The semiconductor package of claim 1,
wherein a distance between the second upper through via and the upper semiconductor chip is shorter than a distance between the first upper through via and the upper semiconductor chip; and
wherein a distance between the second lower through via and the lower semiconductor chip is shorter than a distance between the first lower through via and the lower semiconductor chip.

7. The semiconductor package of claim 6,
wherein the upper RDL extends from the upper semiconductor chip to bypass the second upper through via to reach the first upper through via; and
wherein the lower RDL extends from the lower semiconductor chip to bypass the second lower through via to reach the first lower through via.

8. The semiconductor package of claim 1, wherein the upper RDL and the second lower through via constitute an electric path which is independent from the lower RDL.

9. The semiconductor package of claim 1, further comprising an interconnection layer, wherein the lower module is stacked on the interconnection layer;
a base module disposed between the interconnection layer and the lower module,
wherein the base module includes:
a base semiconductor chip;
a base interposing bridge spaced apart from the base semiconductor chip and configured to include a first base through via and a second base through via; and
a base encapsulant encapsulating the base semiconductor chip and the base interposing bridge.

10. The semiconductor package of claim 9, wherein the first and second base through vias overlap with the first and second lower through vias, respectively.

11. A semiconductor package comprising:
a lower module; and
an upper module stacked on the lower module,
wherein the lower module includes:
a lower semiconductor chip;
a first lower interposing bridge spaced apart from the lower semiconductor chip and configured to include a first lower through via and a second lower through via, wherein the first lower through via is disposed between the lower semiconductor chip and the second lower through via;
a second lower interposing bridge spaced apart from the lower semiconductor chip on an opposite side of the lower semiconductor chip, compared to the first lower interposing bridge, and configured to include a third lower through via and a fourth lower through via, wherein the fourth lower through via is disposed between the lower semiconductor chip and the third lower through via;
a lower encapsulant encapsulating the lower semiconductor chip and the first and second lower interposing bridges;
a first lower redistributed line (RDL) extending to connect the lower semiconductor chip to the first lower through via; and
a second lower RDL extending to connect the lower semiconductor chip to the third lower through via,
wherein the upper module includes:
an upper semiconductor chip;
a first upper interposing bridge spaced apart from the upper semiconductor chip and configured to include a first upper through via and a second upper through via, wherein the first upper through via is disposed between the upper semiconductor chip and the second upper through via;
a second upper interposing bridge spaced apart from the upper semiconductor chip on an opposite side of the lower semiconductor chip, compared to the first upper interposing bridge, and configured to include a third upper through via and a fourth upper through via, wherein the fourth upper through via is disposed between the upper semiconductor chip and the third upper through via;
an upper encapsulant encapsulating the upper semiconductor chip and the first and second upper interposing bridges;
a first upper RDL extending to connect the upper semiconductor chip to the first upper through via; and
a second upper RDL extending to connect the upper semiconductor chip to the third upper through via, and
wherein the first upper through via overlaps with the second lower through via.

12. The semiconductor package of claim 11, wherein the upper module has substantially the same configuration as the lower module.

13. The semiconductor package of claim 12,
wherein the upper semiconductor chip has substantially the same configuration as the lower semiconductor chip;

wherein the first upper interposing bridge has substantially the same configuration as the first lower interposing bridge;
wherein the second upper interposing bridge has substantially the same configuration as the second lower interposing bridge;
wherein the first upper RDL has substantially the same shape as the first lower RDL; and
wherein the second upper RDL has substantially the same shape as the second lower RDL.

14. The semiconductor package of claim 13, wherein the upper module is laterally offset, relative to the lower module by an array pitch of the first and second lower through vias.

15. The semiconductor package of claim 14,
wherein the second upper RDL extends from the upper semiconductor chip to bypass the fourth upper through via to reach the third upper through via; and
wherein the second lower RDL extends from the lower semiconductor chip to bypass the fourth lower through via to reach the third lower through via.

16. The semiconductor package of claim 11, wherein the first upper RDL and the second lower through via constitute an electric path which is independent from the first lower RDL.

17. The semiconductor package of claim 11, further comprising an interconnection layer, wherein the lower module is stacked on the interconnection layer;
a base module disposed between the interconnection layer and the lower module,
wherein the base module includes:
a base semiconductor chip;
a first base interposing bridge spaced apart from the base semiconductor chip and configured to include a first base through via and a second base through via;
a second base interposing bridge spaced apart from a side of the base semiconductor chip opposite to the first base interposing bridge and configured to include a third base through via and a fourth base through via; and
a base encapsulant encapsulating the base semiconductor chip and the first and second base interposing bridges.

18. The semiconductor package of claim 17,
wherein the first and second base through vias overlap with and are connected to the first and second lower through vias, respectively, and the third and fourth base through vias overlap with and are connected to the third and fourth lower through vias, respectively.

19. A semiconductor package comprising:
a lower module; and
an upper module stacked on the lower module,
wherein each of the lower module and the upper module includes:
a semiconductor chip;
an interposing bridge spaced apart from the semiconductor chip and configured to include a first through via and a second through via;
an encapsulant encapsulating the semiconductor chip and the interposing bridge; and
a redistributed line (RDL) extending to connect the semiconductor chip to the first through via, and
wherein the upper module is laterally offset, relative to the lower module, by an array pitch of the first and second through vias such that the first through via of the upper module overlaps with and is connected to the second through via of the lower module.

20. The semiconductor package of claim 19, further comprising an interconnection layer, wherein the lower module is stacked on the interconnection layer;
a base module disposed between the interconnection layer and the lower module,
wherein the base module includes:
a base semiconductor chip;
a base interposing bridge spaced apart from the base semiconductor chip and configured to include a first base through via and a second base through via that overlap with and are connected to respective ones of the first through via and the second through via of the lower module; and
a base encapsulant encapsulating the base semiconductor chip and the base interposing bridge.

* * * * *